(12) United States Patent
Healy

(10) Patent No.: US 11,445,619 B2
(45) Date of Patent: Sep. 13, 2022

(54) SYSTEM AND METHOD FOR HIGH-TEMPERATURE LAMINATION OF PRINTED CIRCUIT BOARDS

(71) Applicant: Matrix Electronics Limited, Mississauga (CA)

(72) Inventor: Kieran Healy, Mississauga (CA)

(73) Assignee: Matrix Electronics Limited, Mississauga (CA)

(*) Notice: Subject to any disclaimer, the term of this patent is extended or adjusted under 35 U.S.C. 154(b) by 0 days.

(21) Appl. No.: 17/177,733

(22) Filed: Feb. 17, 2021

(65) Prior Publication Data

US 2022/0132678 A1     Apr. 28, 2022

Related U.S. Application Data

(63) Continuation-in-part of application No. 17/082,091, filed on Oct. 28, 2020.

(51) Int. Cl.
| | |
|---|---|
| *H05K 3/46* | (2006.01) |
| *B32B 37/26* | (2006.01) |
| *B32B 37/12* | (2006.01) |
| *B32B 38/16* | (2006.01) |

(52) U.S. Cl.
CPC ........... *H05K 3/4635* (2013.01); *B32B 37/12* (2013.01); *B32B 37/26* (2013.01); *B32B 38/162* (2013.01); *B32B 2037/268* (2013.01); *H05K 2203/068* (2013.01)

(58) Field of Classification Search
CPC ....... B30B 15/061; B32B 37/12; B32B 37/26; B32B 37/268; B32B 38/162
See application file for complete search history.

(56) References Cited

FOREIGN PATENT DOCUMENTS

EP          0235582 A2      9/1987

*Primary Examiner* — Carson Gross
(74) *Attorney, Agent, or Firm* — Rowand LLP

(57) ABSTRACT

A method of manufacturing a press pad is disclosed. The method includes: providing a planar pad having a first surface and a second surface opposite to the first surface and a release film sheet, the release film sheet including a polyimide-based film; cleaning the planar pad, the cleaning including electrostatically removing particulates from surfaces of the planar pad; and attaching a release film sheet to the first surface of the planar pad, the release film sheet being attached to the first surface using an acrylic-based adhesive containing thermoplastic polyolefin and methyl acrylate.

7 Claims, 8 Drawing Sheets

SYSTEM AND METHOD FOR HIGH-TEMPERATURE LAMINATION OF PRINTED CIRCUIT BOARDS

RELATED APPLICATIONS

This application is a continuation-in-part of U.S. patent application Ser. No. 17/082,091 filed on Oct. 28, 2020, the entirety of which is incorporated herein by reference.

TECHNICAL FIELD

The present application relates to lamination processes and, more particularly, to press pads for use in laminating printed circuit boards.

BACKGROUND

Press pads are used in laminating multi-layer printed circuit boards (PCBs), flexible circuits, and LCDs. When the layers of the printed circuit board are clean and ready, the layers require alignment punches to ensure that they line up properly. The separate layers are then fused, by joining outer layers with substrate. The fusing of the layers is typically conducted using press plates and pads. Press pads serve various functions, such as controlling heat input and equalizing pressure that is applied to panel surfaces.

BRIEF DESCRIPTION OF THE DRAWINGS

Reference will now be made, by way of example, to the accompanying drawings which show example embodiments of the present application and in which.

Like reference numerals are used in the drawings to denote like elements and features.

DETAILED DESCRIPTION OF EXAMPLE EMBODIMENTS

Figure 1:
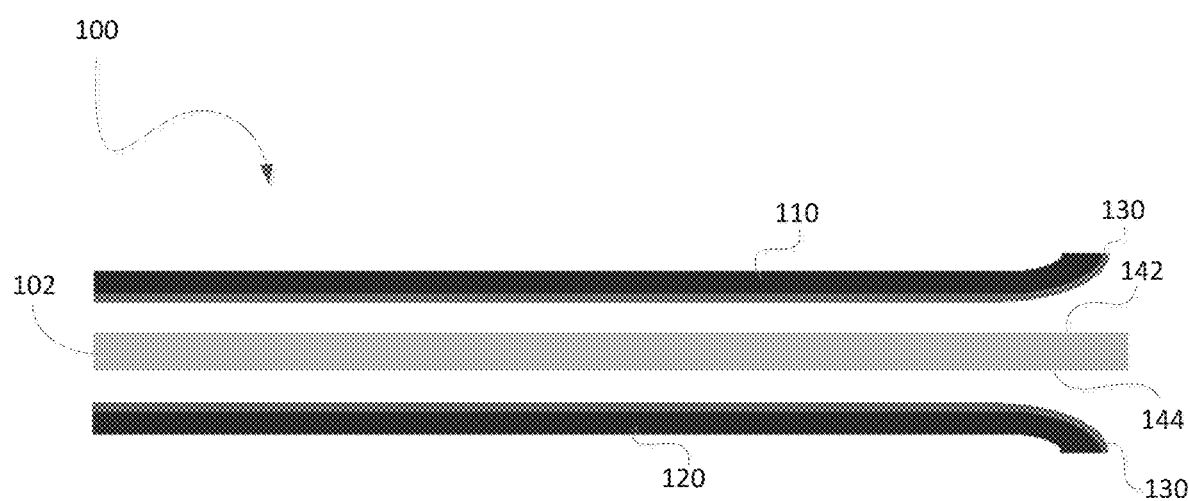
FIG. 1 is a side view of an example press pad for use in laminating printed circuit boards, in accordance with embodiments of the present disclosure.

In an aspect, the present application discloses a press pad for use in lamination of multi-layer circuit boards. The press pad includes: a planar pad having a first surface and a second surface opposite to the first surface; a first sheet of release film coupled to the first surface; and a second sheet of release film coupled to the second surface, wherein the first and second release film sheets are coupled to the first and second surfaces, respectively, using an acrylic-based adhesive containing thermoplastic polyolefin and methyl acrylate, and wherein each of the first and second release film sheets comprises polyimide-based film.

In some implementations, the planar pad may be constructed of at least one of paper or cotton.

In some implementations, a thickness of each release film sheet may be between 0.003 and 0.01 inch.

In some implementations, the acrylic-based adhesive may form a first adhesive layer coupling the first release film sheet to the first surface and a second adhesive layer coupling the second release film sheet to the second surface, and a thickness of each of the first and second adhesive layers may be between 5 and 15 microns.

In some implementations, a thickness of the planar pad may be between 0.05 and 0.06 inch.

In some implementations, the first and second release film sheets may be permanently bonded to the first and second surfaces, respectively, using the acrylic-based adhesive.

In another aspect, the present application discloses a method of manufacturing a press pad. The method includes: providing a planar pad having a first surface and a second surface opposite to the first surface, a first release film sheet, and a second release film sheet, each of the first and second release film sheets including a polyimide-based film; cleaning the planar pad, the cleaning including electrostatically removing particulates from the first and second surfaces of the planar pad; and attaching the first release film sheet to the first surface and the second release film sheet to the second surface, the release film sheets being attached to the first and second surfaces using an acrylic-based adhesive containing thermoplastic polyolefin and methyl acrylate.

In some implementations, the cleaning may include applying a stream of neutrally charged air over portions of one or both of the first and second surfaces of the planar pad.

In some implementations, the method may further include cleaning the first and second release film sheets.

In some implementations, cleaning the first and second release film sheets may include passing the release film sheets over one or more adhesive take-up rollers, the adhesive take-up roller having a tack for removing debris.

In some implementations, the adhesive take-up roller may be a silicon roller.

In some implementations, the method may further include thermally treating the first release film sheet and the second release film sheet along their respective lengths.

In some implementations, the thermal treatment may be adjustable to vary an amount of heat applied to the first and second release film sheets.

In another aspect, the present application discloses a system for manufacturing a press pad. The system includes: a first material handling unit for receiving a planar pad; a second material handling unit for receiving a first release film sheet and a second release film sheet, the release film sheets each having an acrylic-based adhesive containing thermoplastic polyolefin and methyl acrylate applied to one side; and at least one roller coupled with a drive, the drive rotating the roller to pull the first and second release film sheets into contact with the planar pad to attach the release film sheets to respective surfaces of the planar pad.

In some implementations, the system may further include an air curtain for applying a stream of neutrally charged air over portions of the press pad.

In some implementations, the system may further include a chamber through which the planar pad is pulled, the chamber containing one or more electrostatic bars for removing particulates from surfaces of the planar pad.

In some implementations, the chamber may include, in its interior, an air knife for blowing off removed particulates from the surfaces of the planar pad.

In some implementations, the chamber may include, in its interior, a take-up vacuum for collecting the removed particulates.

In some implementations, the system may further include a gripper unit for gripping the planar pad, the gripper unit containing a plurality of needles for contacting the surfaces of the planar pad.

In some implementations, the system may further include a punch and die apparatus for punching hole patterns in the press pad.

In another aspect, the present application discloses a method for manufacturing a printed circuit board. More particularly, a method for using the disclosed press pads during manufacture of a printed circuit board is described. The method includes: providing layers of a printed circuit board; providing steel plates on either side of the printed circuit board; positioning press pads against the steel plates; positioning tooling plates against the press pads; and applying force to the tooling plates in opposite directions.

In another aspect, the present application discloses a press pad for use in lamination of multi-layer circuit boards. The press pad includes: a planar pad having a first surface and a second surface opposite to the first surface; a sheet of release film coupled to the first surface, wherein the release film sheet is coupled to the first surface using an acrylic-based adhesive containing thermoplastic polyolefin and methyl acrylate, and wherein the release film sheet comprises polyimide-based film.

In some implementations, the planar pad may be constructed of at least one of paper or cotton.

In some implementations, a thickness of each release film sheet may be between 0.003 and 0.01 inch.

In some implementations, the acrylic-based adhesive may form an adhesive layer coupling the release film sheet to the first surface, and a thickness of the adhesive layer may be between 5 and 15 microns.

In some implementations, a thickness of the planar pad is between 0.05 and 0.06 inch.

In some implementations, the release film sheet comprises a polyimide-based film containing polytetrafluoroethylene filler particles.

In another aspect, the present application discloses a method of manufacturing a press pad. The method includes: providing a planar pad having a first surface and a second surface opposite to the first surface and a release film sheet, the release film sheet including a polyimide-based film; cleaning the planar pad, the cleaning including electrostatically removing particulates from surfaces of the planar pad; and attaching a release film sheet to the first surface of the planar pad, the release film sheet being attached to the first surface using an acrylic-based adhesive containing thermoplastic polyolefin and methyl acrylate.

In some implementations, the cleaning may include applying a stream of neutrally charged air over portions of surfaces of the planar pad.

In some implementations, the method may further include cleaning the release film sheet.

In some implementations, cleaning the release film sheet may include passing the release film sheet over one or more adhesive take-up rollers, the adhesive take-up roller having a tack for removing debris.

In some implementations, the adhesive take-up roller may be a silicon roller.

In some implementations, the method may further include thermally treating the release film sheet along its length.

In some implementations, the method may further include driving the press pad between a pair of curl elimination guides.

In another aspect, the present application discloses a system for manufacturing a press pad. The system includes: a first material handling unit for receiving a planar pad; a second material handling unit for receiving a release film sheet, the release film sheet having an acrylic-based adhesive containing thermoplastic polyolefin and methyl acrylate applied to one side; and at least one roller coupled with a drive, the drive rotating the roller to pull the release film sheet into contact with the planar pad to attach the release film sheet to a first surface of the planar pad.

In some implementations, the system may further include an air curtain for applying a stream of neutrally charged air over portions of the press pad.

In some implementations, the system may further include a chamber through which the planar pad is pulled, the chamber containing one or more electrostatic bars for removing particulates from surfaces of the planar pad.

In some implementations, the chamber may include, in its interior, an air knife for blowing off removed particulates from the surfaces of the planar pad.

In some implementations, the system may further include a pair of curl elimination guides between which the press pad is pulled.

In some implementations, the system may further include de-curl rollers for driving the press pad between the curl elimination guides.

In some implementations, the system may further include a punch and die apparatus for punching holes patterns in the press pad.

Other example embodiments of the present disclosure will be apparent to those of ordinary skill in the art from a review of the following detailed descriptions in conjunction with the drawings The present application discloses systems and methods for facilitating circuit lamination. More specifically, a press pad for use in laminating printed circuit boards is described. The press pad is designed to offer pressure equalization and heat lagging benefits. For example, the press pad may facilitate hydraulic axis pressure distribution, which may help to mitigate the effects of uneven lamination equipment, thereby resulting in flatter printed circuit boards and better conformation with flex circuits. Further, the disclosed press pad may be used to control temperature rise during the manufacturing of a printed circuit board. Different stack-ups may require different rates of temperature rise, and the press pad may be used to manage heat to ensure that the printed circuit board and prepreg are properly cured.

The press pad can be employed in the manufacture of, for example, rigid printed circuit boards, multi-layer flexible circuits, and liquid crystal displays (LCDs). The press pad construction includes a planar pad that is made from paper and/or cotton, and release film sheets that are coupled to opposing surfaces of the planar pad. The release film sheets are attached to the planar pad using an acrylic-based adhesive containing thermoplastic polyolefin and methyl acrylate.

The disclosed press pad may prevent dust and debris from affecting subsequent processing of a circuit (e.g., multi-layer rigid printed circuit board). The press pad is, in at least some embodiments, a singular construction that includes a planar pad and release film sheets that are coupled to either side of the planar pad. That is, the press pad may be a unitary component, rather than three standalone components, which may be easier for handling and less prone to human error when the press pad is employed for manufacturing a circuit.

Reference will first be made to FIG. 1, which illustrates a side view of an example press pad 100. The press pad 100 may be used in lamination of circuits, such as printed circuit boards or multi-layer flexible circuits.

The press pad 100 includes a planar pad 102. The planar pad 102 is constructed from at least one of cotton or paper. The planar pad 102 forms the main body of the press pad 100. As shown in FIG. 1, the planar pad 102 has a first surface 142 and a second surface 144 opposite to the first surface 142. The planar pad 102 has a thickness that is less than 0.01 inch. For example, the thickness of the planar pad 102 may be between 0.05 and 0.06 inch (e.g., 0.055 inch).

When the press pad 100 contacts the surfaces of circuit topography, the cotton/paper construction of the planar pad 102 may result in portions of the planar pad 102 sticking to the surfaces, thereby requiring cleaning. To prevent potential damage and undesired direct surface contact between the planar pad 102 and circuit surfaces, the press pad 100 is provided with release films surrounding the planar pad 102. More specifically, the press pad 100 includes a first sheet 110 of release film and a second sheet 120 of release film. The first release film sheet 110 is coupled to the first surface 142 of the planar pad 102, and the second release film sheet 120 is coupled to the second surface 144 of the planar pad 102. Each of the first and second release film sheets is a polyimide-based film. That is, the first release film sheet 110 and the second release film sheet 120 each contains polyimide (PI). The presence of PI ensures that the release film sheets have good heat resistance. The poly-based release film sheets 110 and 120 may also contain microparticulate fillers. For example, the release film sheets 110 and 120 may contain diphosphene filler particles.

The release film sheets 110 and 120 are sufficiently thick to provide rigidity to the planar pad 102. In at least some embodiments, the thickness of each of the release film sheets is greater than 0.001 inch. For example, the thickness of each release film sheet may be between 0.003 and 0.01 inch (e.g., 0.005 inch).

The first release film sheet 110 and the second release film sheet 120 are coupled to the first surface 110 and the second surface 120, respectively, of the planar pad 102 using an acrylic-based adhesive 130. The adhesive 130 contains a mixture of thermoplastic polyolefin and methyl acrylate. As illustrated in FIG. 1, the adhesive 130 forms a first adhesive layer coupling the first release film sheet 110 to the first surface 142 of the planar pad 102 and a second adhesive layer coupling the second release film sheet 120 to the second surface 144 of the planar pad 102. In at least some embodiments, the adhesive 130 may be permanently applied to the first and second release film sheets. In particular, the adhesive 130 may be applied to the surface of the first release film sheet 110 that makes contact with the first surface 142 of the planar pad 102 and to the surface of the second release film sheet 120 that makes contact with the second surface 144 of the planar pad 102. In some embodiments, the first and second release film sheets are permanently bonded to the first surface 142 and the second surface 144, respectively, using the adhesive 130.

The adhesive 130 may be uniformly applied across a surface of each of the first release film sheet 110 and the second release film sheet 120. That is, the adhesive 104 may reside at all locations between the release film sheets and the planar pad 102 and applied at approximately the same coat weight irrespective of its location on the surfaces. In at least some embodiments, a layer of the adhesive 130 may have a thickness ranging between 10 and 20 microns (e.g., 15 microns). The thickness of the adhesive may be the same across the entire surface of the release film sheets. Applying the adhesive across the entire surfaces of the release film sheets may enhance rigidity of the press pad 100.

Figure 2:
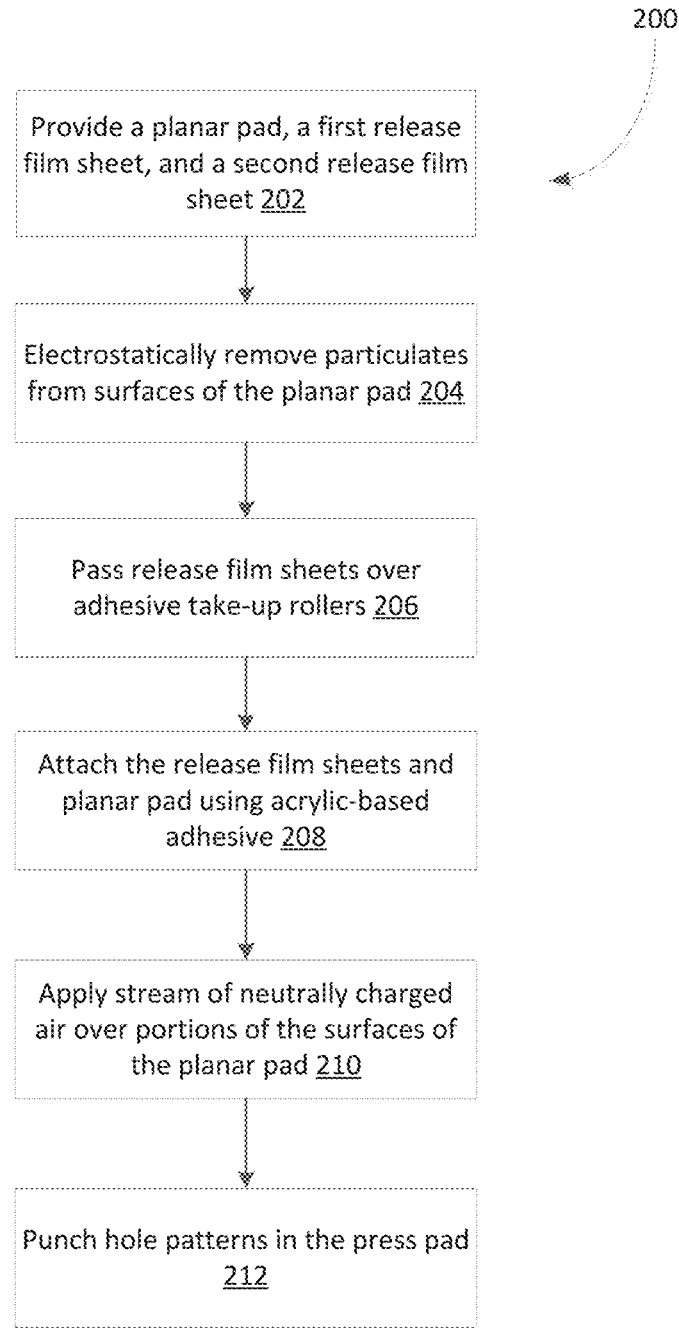
FIG. 2 shows, in flowchart form, an example method of manufacturing a press pad.

Reference is now made to FIG. 2, which shows, in flowchart form, an example method 200 of manufacturing a press pad assembly, such as the press pad 100 of FIG. 1. The method 200 may be performed in a clean room environment.

In operation 202, the method 200 includes providing a planar pad, a first release film sheet and a second release film sheet of the types described with reference to FIG. 1. Specifically, the release film sheets each comprise polyimide-based film, and have an adhesive applied to a surface of the poly-based film. The adhesive may, for example, be an adhesive of the type described above with reference to FIG. 3 (adhesive 130). In particular, the adhesive is acrylic-based and contains thermoplastic polyolefin and methyl acrylate.

The planar pad is cleaned prior to attaching the release film sheets thereto. In operation 204, the planar pad is cleaned by electrostatically removing particulates from its surfaces. In particular, particulates that adhere to surfaces of the planar pad may be removed electrostatically. For example, an electrostatic neutralizer (e.g., electrostatic bars) may be used to break the static bond of any foreign materials or unwanted particulates, and an air knife system (or similar cleaning tool using compressed air) may blow the debris off of the surfaces of the planar pad and/or poly-based film.

In operation 206, the first and second release film sheets are passed over one or more adhesive take-up rollers. The adhesive take-up rollers may, for example, contain one or more tacks for removing debris from surface of the poly-based film. The adhesive take-up roller may, in some embodiments, be a silicon roller.

In operation 208, the cleaned planar pad and poly-based release film sheets are attached to each other using the adhesive. The first and second release film sheets each may have the adhesive applied to one of their surfaces, and the adhesive-containing surface of the release film sheets may be made to contact the first and second surfaces, respectively, of the planar pad.

In operation 210, a stream of neutrally charged air may be applied over portions of the planar pad and/or the poly-based release film sheets. This de-ionization step may reduce static electricity on the surfaces of the planar pad and the release film sheets, which can prevent debris (e.g., hair, etc.) from sticking to the surfaces.

In some embodiments, the planar pad and/or the release film sheets are thermally treated along their respective lengths. In at least some embodiments, the thermal treatment may be adjustable to vary the amount of heat that is applied to the planar pad and/or the release film sheets. That is, the amount of heat applied may be varied during thermal treatment. For example, one or both of the planar pad and the release film sheets may be guided over respective static heating elements or sources. Increasing the amount of applied heat may make the release film sheet more "pliable" or "malleable", helping to reduce internal stress along the length of the poly-based film.

In operation 212, hole patterns may be punched in the press pad. For example, a punch tooling apparatus (e.g., punch and die) may be used to punch a plurality of holes into the press pad.

Figure 3:
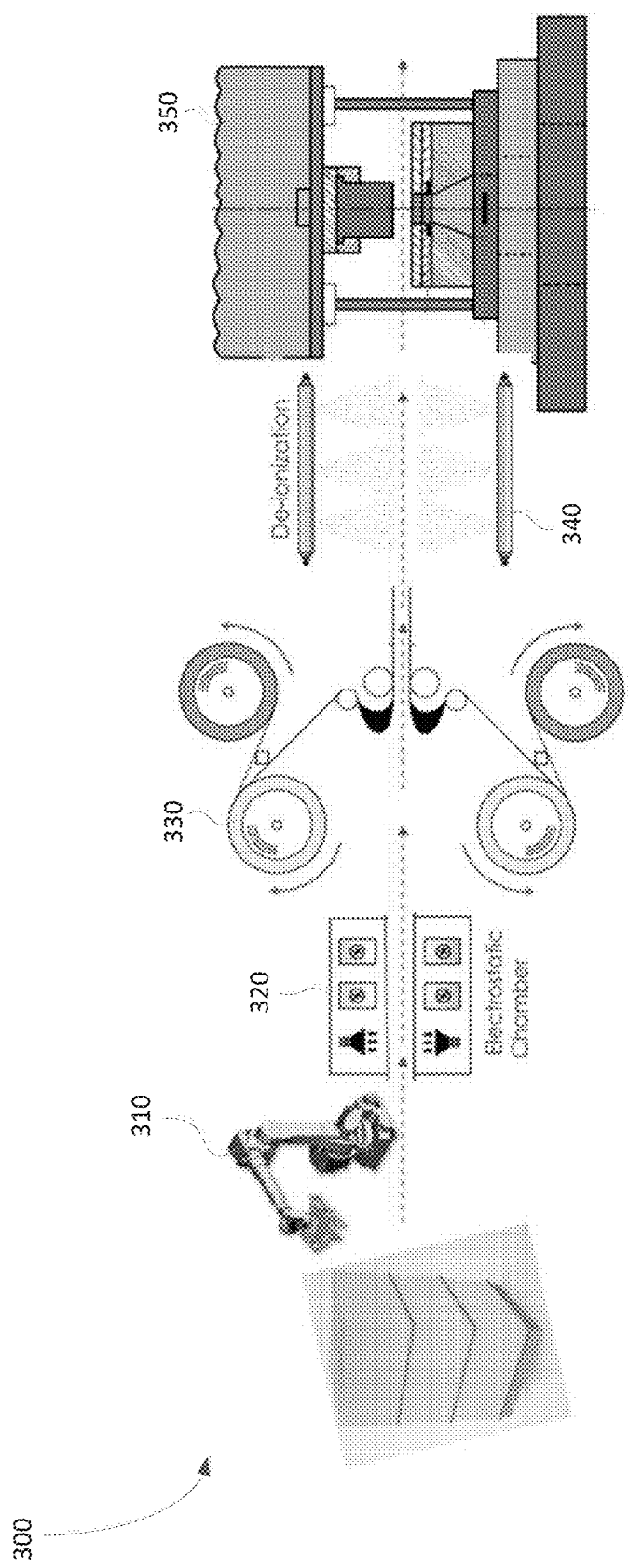
FIG. 3 is a block diagram of an example system for manufacturing a press pad.

Reference is now made to FIG. 3, which illustrates, in block form, a sample system 300 for manufacturing a press pad assembly, such as the press pad 100 of FIG. 1. The components of system 300 may be located in a clean room environment, in some embodiments.

The system 300 includes a first material handling unit 310. The first material handling unit 310 receives the planar pad of the type described herein with reference to FIG. 1. The planar pad may be received in roll form. In at least some embodiments, the first material handling unit may be, or include, a gripper unit for gripping the planar pad. The gripper unit may contain a plurality of needles for contacting the surfaces of the planar pad.

The system 300 also includes a second material handling unit. The second material handling unit is for receiving a first release film sheet and a second release film sheet of the type described above with reference to FIG. 1. In at least some embodiments, the poly-based release film sheets each have an adhesive applied to a surface of sheet. That is, one side of the release film sheet has an adhesive of the type described herein applied thereon. In at least some embodiments, a liner, such as a Mylar liner, may act as a backing to the adhesive. A Mylar take-up roller 330 may provide the Mylar liner for attaching to the adhesive. The poly-based release film sheets may be received in roll form. The second material handling unit may, in some embodiments, allow the rolls to rotate.

At least one roller (or other material gripper) is provided in the system 300, and, at least one of the rollers (or another material gripper) is coupled with a drive. The drive rotates the roller (or otherwise drives the material gripper) causing the roller to pull the planar pad into contact with the poly-based release film sheets to attach the release film sheets to the planar pad using the adhesive applied to the surface of the release film sheets.

The at least one roller may be configured to remove any air bubbles between the poly-based release film sheets and the planar pad and may, in at least some embodiments, be configured to apply a force to the release film sheets to hold the poly-based film taut during the attaching.

The system 300 may also include at least one heating element for adjustably applying heat to one or both of the planar pad and the release film sheets along their respective lengths. The heating elements may, in some embodiments, be positioned adjacent to the at least one roller such that the planar pad and/or the release film sheets may be thermally treated using the heating elements prior to attaching the planar pad and the release film sheets. The amount of heat applied by the heating elements may be adjustable, such that the temperature at which the planar pad and the release film sheets are thermally treated can vary. For example, the temperature may be varied based on a thickness of the release film sheet that is being treated.

The system 300 may include a de-ionization source 340. The de-ionization source 340 may provide an air curtain for applying a stream of neutrally charged air over portions of one or both of the press pad (i.e., planar pad and the release film sheets). In some embodiments, as shown in FIG. 3, the de-ionization may be performed for both the planar pad and the poly-based film.

The system 300 may include a chamber 320 for electrostatic cleaning. The planar pad is pulled through the chamber by at least one roller. In at least some embodiments, the chamber 320 includes one or more electrostatic bars for removing particulates from surfaces of one or both of the planar pad and the poly-based film. For example, the chamber 320 may include, in its interior, a plurality of electrostatic bars (or different electrostatic neutralizer) an air knife for blowing off removed particulates from the surfaces of planar pad. The chamber 320 may also include, in its interior, a take-up vacuum for collecting the removed particulates.

The system 300 may also include a cleaner for cleaning the planar pad 102 prior to the attaching. Such cleaners may include one or more adhesive take-up rollers which have a tack for removing debris. In some embodiments, the adhesive take-up rollers may include silicone rollers.

The system 300 may also include a punching station which adds tooling holes for receipt in the lamination press. The punching station may include, for example, a punch and die apparatus for punching hole patterns in the press pad. The punching station is located so that holes are applied after the planar pad has been attached to the release film sheets.

The system 300 may also include a shearing station. The shearing station cuts the press pad into panels that fit within the lamination press. For example, in one embodiment, the press pad is cut into 18"×24" panels.

Figure 4:
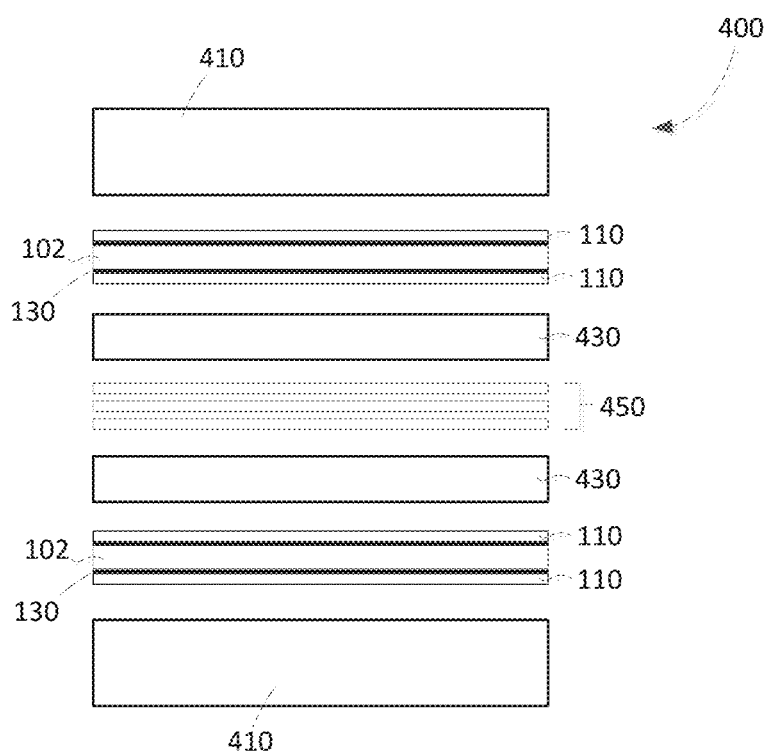
FIG. 4 is a block diagram of an example lamination press arrangement.

FIG. 4 is a block diagram of an example lamination press arrangement 400. The lamination press arrangement 400 may be employed in the manufacture of a circuit, such as a multi-layer printed circuit board.

The lamination press arrangement 400 includes lamination presses 410 used to manufacture a multi-layer printed circuit board. The lamination press 410 may be a specialized hydraulic press with heated platens. The heated platens may be used to cure prepreg. A prepreg (or pre-impregnated layer) is fiberglass that is impregnated with a resin (i.e., a thermosetting epoxy). The resin is dried but not hardened such that it flows when heated, by the lamination press 410, to a curing temperature.

The lamination press 410 is configured to apply heat and pressure to layers 450 which form the printed circuit board to bond them together.

The lamination press 410 may include caul plates (not shown in FIG. 4). The caul plates may include both an upper and a lower caul plate. The caul plates (which may also be referred to as carrier plates or tooling plates) rest in the lamination press 410. More particularly, the caul plates may be adjacent to the heated platens.

The lamination press arrangement 400 includes padding which is inserted between the lamination press 410 and the layers 450 that will form the printed circuit board. That is, there is an upper and lower padding, bounding the layers 450 that will form the printed circuit board. The padding comprises press pads, such as the press pad 100 of FIG. 1. In particular, the padding includes a planar pad 102, having release film sheets 110 that are coupled to both sides of the planar pad 102. The release film sheets 110 are attached to the planar pad 102 using adhesives 130. The padding is used to control the rate of heat transfer between the heated platens and the layers 450 of the printed circuit board. Further, the padding can be used to compensate for imperfections such as non-parallel, bowed or warped platens, imperfections in the caul plates, etc.

FIG. 4 shows plates 430 which are positioned between the padding and the layers 450. The plate 430 may be a hard metal plates, such as stainless steel (in which case the plate 430 may be referred to as a stainless-steel plate). In some embodiments, the plate 430 may have a release film sheet that is coupled to the surface of the plate 430 that is adjacent to the layers 450. That is, a release film sheet may be interposed between the plates 430 and the layers 450.

Figure 5:
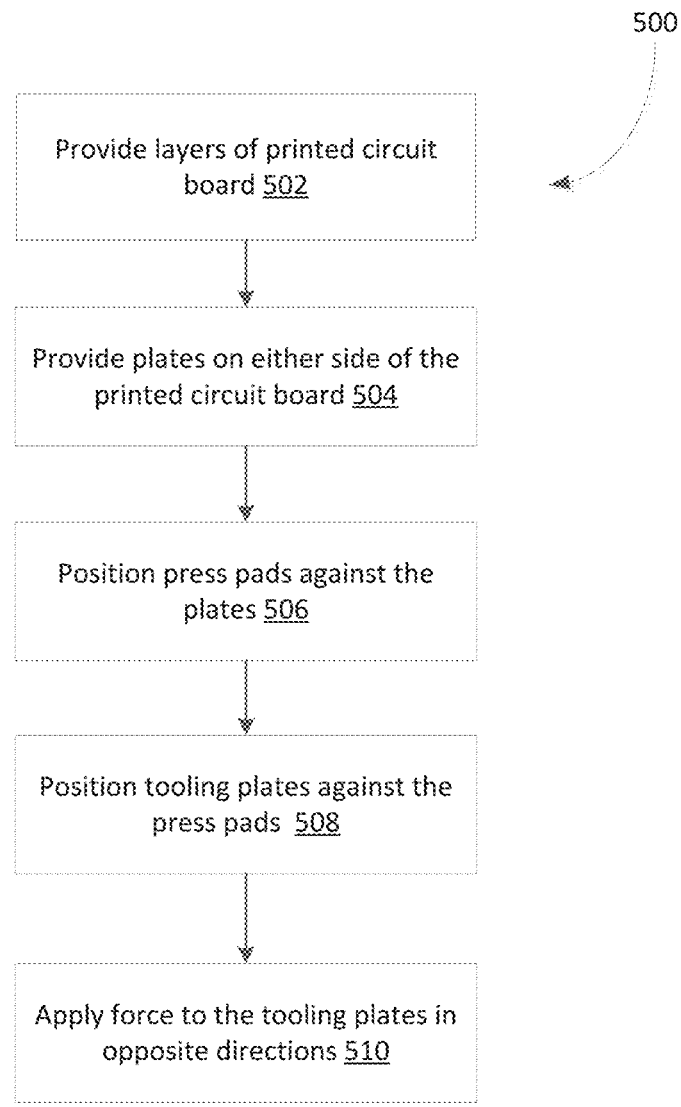
FIG. 5 shows, in flowchart form, an example method of manufacturing a printed circuit board using the press pad of FIG. 1.

FIG. 5 shows, in flowchart form, an example method 500 of manufacturing a printed circuit board. More specifically, the method 500 may be performed during lamination of a printed circuit board.

In operation 502, the method 500 includes providing layers of a printed circuit board. The layers may include, for example, a pair of prepregs and one or more copper clad laminates (CCL) positioned between the prepregs. The first prepreg may be adjacent to the CCL and the second prepreg may be located at a side of the CCL that opposes the side adjacent to the first prepreg.

The copper clad laminate (CCL) may be a two-sided CCL. In practice, there may be more than one CCL included in forming a multi-layer printed circuit board. Each CCL layer may be separated from adjacent CCL layers with prepreg.

In operation 504, the method 500 includes providing plates on either side of the layers of the printed circuit board. The plates may, for example, be steel plates. In operation 506, press pads are positioned against the plates. More specifically, press pads are positioned against the "free" sides of the plates (i.e., the sides of the plates that are not adjacent to the layers of the printed circuit board).

In operation 508, tooling plates are positioned against the press pads. In operation 510, force is applied to the tooling plates in opposite directions. In particular, pressure is applied to force the tooling plates to move toward each other such that the layers of the printed circuit board are pressed together. Heat and pressure are thus applied to the layers, and the epoxy melts inside of the prepreg that, along with the pressure, fuses the layers together.

Figure 6:
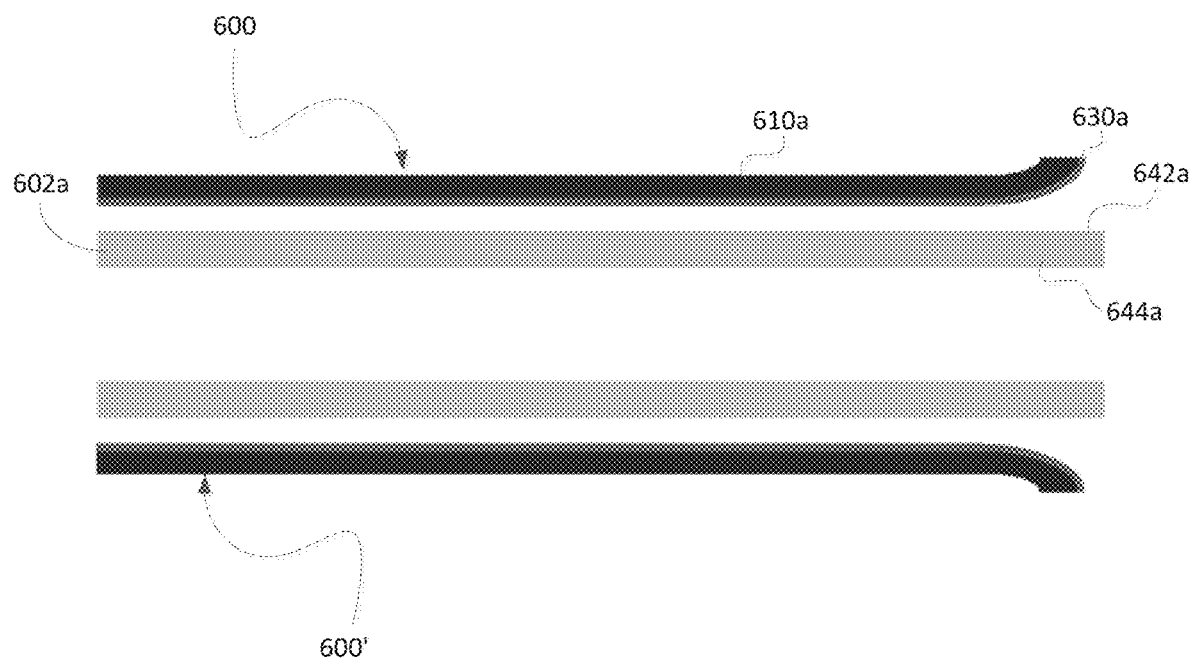
FIG. 6 is a side view of two example press pads for use in laminating printed circuit boards.

Reference is now made to FIG. 6, which illustrates a side view of two example press pads 600 and 600'. The press pads 600 and 600' may be used in lamination of circuits, such as printed circuit boards or multi-layer flexible circuits. Specifically, the press pads 600 and 600' may be used together in a high-temperature lamination cycle. High temperatures may require the use of two press pads in conjunction to lag heat during lamination. The press pads 600 and 600' are structurally identical, and the description below will refer to features of the press pad 600 without loss of generality.

The press pad 600 includes a planar pad 602a. The planar pad 602a is constructed from at least one of cotton or paper. The planar pad 602a forms the main body of the press pad 600. As shown in FIG. 6, the planar pad 602a has a first surface 642a and a second surface 644a opposite to the first surface 642a. The planar pad 602a has a thickness that is less than 0.01 inch. For example, the thickness of the planar pad 602a may be between 0.05 and 0.06 inch (e.g., 0.055 inch).

More specifically, the press pad 600 includes a sheet 610a of release film. The release film sheet 610a is coupled to the first surface 642a of the planar pad 602a. The release film sheet 610a is a polyimide-based film. That is, the release film sheet 610a contains polyimide (PI). The presence of PI ensures that the release film sheet has good heat resistance. The poly-based release film sheet 610a may also contain microparticulate fillers. For example, the release film sheet 610a may contain diphosphene filler particles and/or polytetrafluoroethylene filler particles.

The release film sheet 610a is sufficiently thick to provide rigidity to the planar pad 602a. In at least some embodiments, the thickness of the release film sheet 610a is greater than 0.001 inch. For example, the thickness of the release film sheet 610a may be between 0.003 and 0.01 inch (e.g., 0.005 inch).

The release film sheet 610a is coupled to the first surface 642a of the planar pad 602 using an acrylic-based adhesive 630a. The adhesive 630a contains a mixture of thermoplastic polyolefin and methyl acrylate. As illustrated in FIG. 6, the adhesive 630a forms an adhesive layer coupling the release film sheet 610a to the first surface 642a of the planar pad 602a. In at least some embodiments, the adhesive 630a may be permanently applied to the release film sheet 610a. In particular, the adhesive 630a may be applied to the surface of the release film sheet 610a that makes contact with the first surface 642a of the planar pad 602a. In some embodiments, the release film sheet is permanently bonded to the first surface 642a using the adhesive 630a.

The adhesive 630a may be uniformly applied across a surface of the release film sheet 610a. That is, the adhesive 630a may reside at all locations between the release film sheets and the planar pad 602a and applied at approximately the same coat weight irrespective of its location on the surfaces. In at least some embodiments, a layer of the adhesive 630a may have a thickness ranging between 10 and 20 microns (e.g., 15 microns). The thickness of the adhesive may be the same across the entire surface of the release film sheet. Applying the adhesive across the entire surface of the release film sheet may enhance rigidity of the press pad 600.

Figure 7:
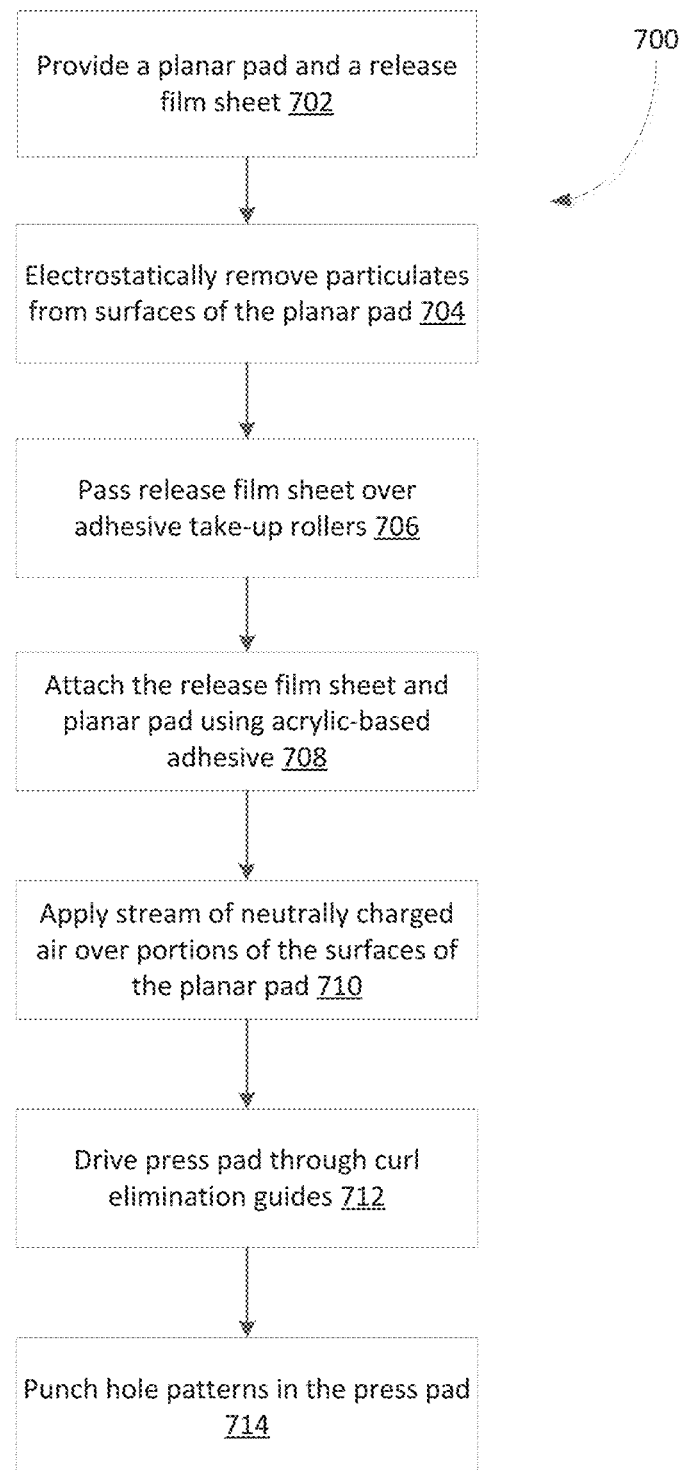
FIG. 7 shows, in flowchart form, another example method of manufacturing a press pad.

Reference is now made to FIG. 7, which shows, in flowchart form, an example method 700 of manufacturing a press pad assembly, such as the press pad 600 of FIG. 6. The method 700 may be performed in a clean room environment.

Operations 702, 704, 706, 708 and 710 may be performed in a similar manner as operations 202, 204, 206, 208 and 210, respectively, of method 200 in FIG. 2. For a press pad having a planar pad and a release film that is coupled to only a single side of the planar pad, the asymmetrical structure of the press pad may result in undesired curvature during the lamination process. To rectify such scenarios, the press pad may undergo a de-curling process for eliminating curls (e.g., curvature) associated with the press pad. In operation 712, the press pad is driven through at least a pair of curl elimination guides. In at least some embodiments, the curl elimination guides may be duckbill-shaped. For example, the pair of curl elimination guides may cooperatively define a first opening for receiving a press pad and a second opening, downstream of the first opening, through which the press pad is pulled such that the first opening is substantially larger than the second opening. In particular, the second opening may comprise a narrow slit through which the de-curled press pad is drawn out.

Figure 8:
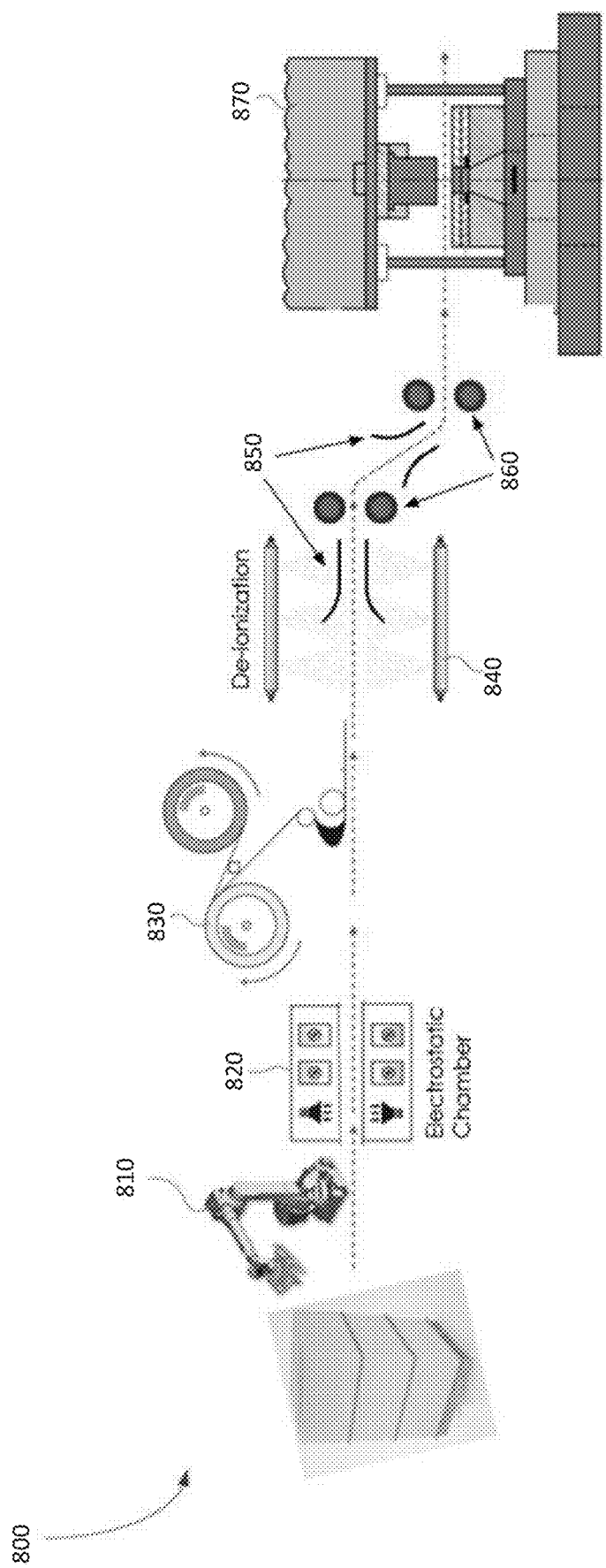
FIG. 8 is a block diagram of another example system for manufacturing a press pad.

Reference is now made to FIG. 8 which illustrates, in block form, a sample system 800 for manufacturing a press pad assembly, such as the press pad 600 of FIG. 6. The components of system 800 may be located in a clean room environment, in some embodiments.

The features of system 800 are substantially similar to the features of system 300 of FIG. 3. In particular, the system 800 includes a first material handling unit 810, an electrostatic cleaning chamber 820, take-up rollers 830, and a de-ionization source 840. These features of system 800 may function and/or be operated in a similar manner as corresponding features of the system 300.

The system 800 additionally includes a plurality of curl elimination guides 850 and a plurality of de-curl rollers 860. As shown in FIG. 8, after undergoing de-ionization, a press pad assembly may be guided through the curl elimination guides 850 for de-curling, or eliminating curvatures in the press pad. The curl elimination guides 850 may be disposed in pairs and cooperate to define a duckbill-shaped opening for receiving the press pad. The press pad is driven through the curl elimination guides 850 by operation of the de-curl rollers 860. That is, the de-curl rollers 860 drive the press pad through the curl elimination guides 850.

The system 800 may also include a cleaner for cleaning the planar pad prior to the attaching. Such cleaners may include one or more adhesive take-up rollers which have a tack for removing debris. In some embodiments, the adhesive take-up rollers may include silicone rollers.

The system 800 may also include a punching station which adds tooling holes for receipt in the lamination press. The punching station may include, for example, a punch and die apparatus for punching hole patterns in the press pad. The punching station is located so that holes are applied after the planar pad has been attached to the release film sheets.

The system 800 may also include a shearing station. The shearing station cuts the press pad into panels that fit within the lamination press. For example, in one embodiment, the press pad is cut into 18"×24" panels.

The various embodiments presented above are merely examples and are in no way meant to limit the scope of this application. Variations of the innovations described herein will be apparent to persons of ordinary skill in the art, such variations being within the intended scope of the present application. In particular, features from one or more of the above-described example embodiments may be selected to create alternative example embodiments including a sub-combination of features which may not be explicitly described above. In addition, features from one or more of the above-described example embodiments may be selected and combined to create alternative example embodiments including a combination of features which may not be explicitly described above. Features suitable for such combinations and sub-combinations would be readily apparent to persons skilled in the art upon review of the present application as a whole. The subject matter described herein and in the recited claims intends to cover and embrace all suitable changes in technology.

The invention claimed is:

1. A method of manufacturing a press pad, the method comprising:
   providing a planar pad having a first surface and a second surface opposite to the first surface and a release film sheet, the release film sheet including a polyimide-based film;
   cleaning the planar pad, the cleaning including electrostatically removing particulates from surfaces of the planar pad; and
   attaching the release film sheet to the first surface of the planar pad, the release film sheet being attached to the first surface using an acrylic-based adhesive containing thermoplastic polyolefin and methyl acrylate.

2. The method of claim 1, wherein the cleaning includes applying a stream of neutrally charged air over portions of surfaces of the planar pad.

3. The method of claim 1, further comprising cleaning the release film sheet.

4. The method of claim 3, wherein cleaning the release film sheet includes passing the release film sheet over at least one adhesive take-up roller, the at least one adhesive take-up roller having a tack for removing debris.

5. The method of claim 4, wherein the at least one adhesive take-up roller is a silicon roller.

6. The method of claim 1, further comprising thermally treating the release film sheet along its length.

7. The method of claim 1, further comprising driving the press pad between a pair of curl elimination guides.

* * * * *